(12) United States Patent
Persson et al.

(10) Patent No.: US 8,049,567 B2
(45) Date of Patent: Nov. 1, 2011

(54) CIRCUIT FOR PHASE LOCKED OSCILLATORS

(76) Inventors: Johan Persson, Kista (SE); Yan Zhou, Solna (SE); Johan Åkerman, Sollentuna (SE)

( * ) Notice: Subject to any disclaimer, the term of this patent is extended or adjusted under 35 U.S.C. 154(b) by 233 days.

(21) Appl. No.: 12/262,772

(22) Filed: Oct. 31, 2008

(65) Prior Publication Data

US 2009/0115541 A1    May 7, 2009

Related U.S. Application Data

(60) Provisional application No. 60/984,416, filed on Nov. 1, 2007.

(51) Int. Cl.
*H03L 7/00* (2006.01)
(52) U.S. Cl. ............... 331/2; 331/45; 331/53; 365/171; 365/173; 257/421; 428/811
(58) Field of Classification Search .............. 365/171, 365/173; 428/811; 257/421; 331/2, 46, 331/53
See application file for complete search history.

(56) References Cited

U.S. PATENT DOCUMENTS
7,678,475 B2 *  3/2010  Slavin et al. ................. 428/811

OTHER PUBLICATIONS

J. Grollier et al., "Synchronization of spintransfer oscillators driven by stimulated microwave currents", Phys. Rev. B, 2006, 73, 060409-0604012.

* cited by examiner

*Primary Examiner* — Arnold Kinkead
(74) *Attorney, Agent, or Firm* — Renner, Otto, Boisselle & Sklar, LLP

(57) ABSTRACT

A circuit comprising a DC current source and at least two spin torque oscillators, the at least two spin torque oscillators being electrically coupled to each other and to the DC current source. A circuit comprising phase shifting means is connected in such a way as to cause a phase shift between current and voltage through the spin torque oscillators. An advantage is that the controlled phase shift significantly increases the tolerance for deviating anisotropy fields, which makes manufacturing of spin torque oscillator devices much more feasible in practice.

13 Claims, 7 Drawing Sheets

CIRCUIT FOR PHASE LOCKED OSCILLATORS

This application claims priority of U.S. Provisional Application No. 60/984,416, filed on Nov. 1, 2007, which is incorporated herein by reference in its entirety.

FIELD OF THE INVENTION

The present invention relates generally to phase locked spin torque oscillators, and more particularly to a circuit comprising electrically coupled phase locked spin torque oscillators and use of such a circuit.

BACKGROUND OF THE INVENTION

Magnetic tunnel junctions and spin valves are commonly used as MRAM storage bits and magnetic read heads. The discovery that the magnetization of a free layer can be manipulated by means of a transferred spin polarized current, enables the magnetization of the free layer of such a structure to be manipulated in such a way that the magnetization of the layer keeps rotating. The resulting oscillation in resistance of the structure can be utilized for switching of MRAM elements or as an oscillating component, a spin torque oscillator (STO).

A spin valve is typically a sandwiched structure consisting of two ferromagnetic layers separated by a thin non-magnetic spacer layer. A magnetic tunnel junction (MTJ) would have the same structure but the non-magnetic layer would in this case be insulating, allowing for tunneling between the two ferromagnetic layers.

One of the ferromagnetic layers is said to be the "pinned layer" because it is magnetically pinned or oriented in a fixed direction. This can be achieved by applying an adjacent anti ferromagnetic layer, a pinning layer, which will affect and hold the magnetization of the pinned layer through exchange coupling. The other ferromagnetic layer is called the free layer since its magnetization is allowed to rotate in response to outside stimulus in form of magnetic fields or as in this case action by spin torque (transferred magnetic angular momentum from electrons).

The total resistance of the layered structure will depend on the orientation of the fixed and pinned layers. A parallel configuration will give a lower resistance than the anti parallel case.

The spin torque effect is when polarized electrons moving into the free layer of the structure transfer a net magnetic moment to the layer, offsetting the Gilbert damping of the magnetization. This can make the free layer magnetization switch direction or cause the magnetization to oscillate, depending on the amount of magnetic moment being transferred, that is, the amount of current per unit area passing in to the layer.

A spin valve or magnetic tunnel junction with a free layer performing such an oscillator is called a spin torque oscillator.

It has been shown experimentally that spin torque oscillators can phase lock to each other forming an oscillating signal of higher quality than the individual signals.

A spin torque oscillator will have many practical benefits. The lateral size is very small, typically below 100 nm, a dimension significantly smaller than the classical oscillators based on LC tanks or dielectric resonance. When integrated in a microchip an STO will save space and cost in different applications. Furthermore the frequency generated in an STO is sweepable by means of the current passed trough the device. Additionally, the frequency can be adjusted by applying different external fields.

Applications range from mobile phones, satellite communication, radar and ship transceivers.

At the present time the output signal of a single STO is too weak for practical applications. J. Grollier et al (Grollier, J.; Cros, V. & Fert, A. *Synchronization of spin-transfer oscillators driven by stimulated microwave currents*, Phys. Rev. B, 2006, 73, 060409-0604012) has theoretically proposed that STOs may be connected in series in order to increase the power of the output signal. The STOs will phase lock under some specific circumstances and will in the phase locked state provide a signal less sensitive to noise and with higher output.

However, discrepancies in fabrication mean that the shape-anisotropy fields of magnetic layers in the spin torque oscillators can differ greatly, especially as elements get smaller. Also, edge effects and roughness has a profound effect on the anisotropy of small magnetic structures. According to experimental results, a shape anisotropy field difference of 4% is the maximum tolerance for broad-band phase-locking behavior.

When the size of components reach the nano level, surface roughness becomes an increasing problem, and edge effects automatically introduce a variation in the effective anisotropy field. This will make an effective phase lock through serial connection hard to achieve.

SUMMARY OF THE INVENTION

An object of the present invention is to provide a means to reduce sensitivity to fabrication flaws (i.e. anisotropy field deviations) in phase locked spin torque oscillators (STO:s).

According to an aspect, the invention is based on controlling the phase shift of connecting AC current between phase locked spin torque oscillators, which has a profound effect on fabrication tolerances. By controlling the phase shift, the tolerance for deviating anisotropy fields can increase by an order of magnitude, to as much as 145%.

The results underlying the present invention have been published in JAP (*Phase-locked spin torque oscillators: Impact of device variability and time delay*, J. Perssin, Yan Zhou, and Johan Akerman, *J. Appl. Phys.* 101, 09A503 (2007), published online Apr. 26, 2007), which article is hereby incorporated by reference.

The mechanism behind this phase lock is related to the findings presented in a subsequent article in JAP (*Intrinsic phase shift between a spin torque oscillator and an alternating current*, Yan Zhou, J. Persson, and Johan Akerman, *J. Appl. Phys.* 101, 09A510 (2007), published online on May 7, 2007), the contents of which hereby is incorporated by reference. In this article, the preferred phase shift of an STO locking to an external AC current is investigated.

According to an aspect of the invention, the control of the phase shift is realized by designing the inductive and capacitive properties of the interconnecting circuit between the phase locked spin torque oscillators.

According to an embodiment of the present invention, this is realized in a circuit comprising a DC current source and at least two spin torque oscillators. The at least two spin torque oscillators are electrically coupled to each other and to the DC current source. A circuit comprising phase shifting means is connected in such a way as to cause a phase shift between current and voltage through the spin torque oscillators.

According to another embodiment of the present invention, the DC source comprises the phase shifting means instead of a circuit comprising the same.

An advantage of the present invention is that the controlled phase shift significantly increases the tolerance for deviating anisotropy fields, which makes manufacturing of spin torque oscillator devices much more feasible in practice.

Typically, the phase shifting means comprises a capacitance such as a capacitor.

According to an other embodiment of the present invention, a transistor is provided as the phase shifting element. This embodiment provides a further advantage in that a direct amplification of the signal can be achieved without further components needed.

Alternatively, the phase shifting means comprises an inductance such as an inductor.

According to yet another embodiment of the present invention, the phase shifting means comprises a combination of two or more components selected from the set of: capacitance, inductance, or transistor.

The present invention is also directed to use of a circuit according to any one of the embodiments and/or aspects above. This circuit is suitable for producing a microwave signal.

The present invention will also work for newer spin torque oscillator designs. These new designs will all get rid of the need to apply a perpendicular magnetic field to achieve oscillations. This will be described in more detail in the section "detailed description of the invention".

BRIEF DESCRIPTION OF THE DRAWINGS

The features and advantages of the present invention will become further apparent from the following detailed description and the accompanying drawings, of which.

DETAILED DESCRIPTION OF THE INVENTION

Figure 1:
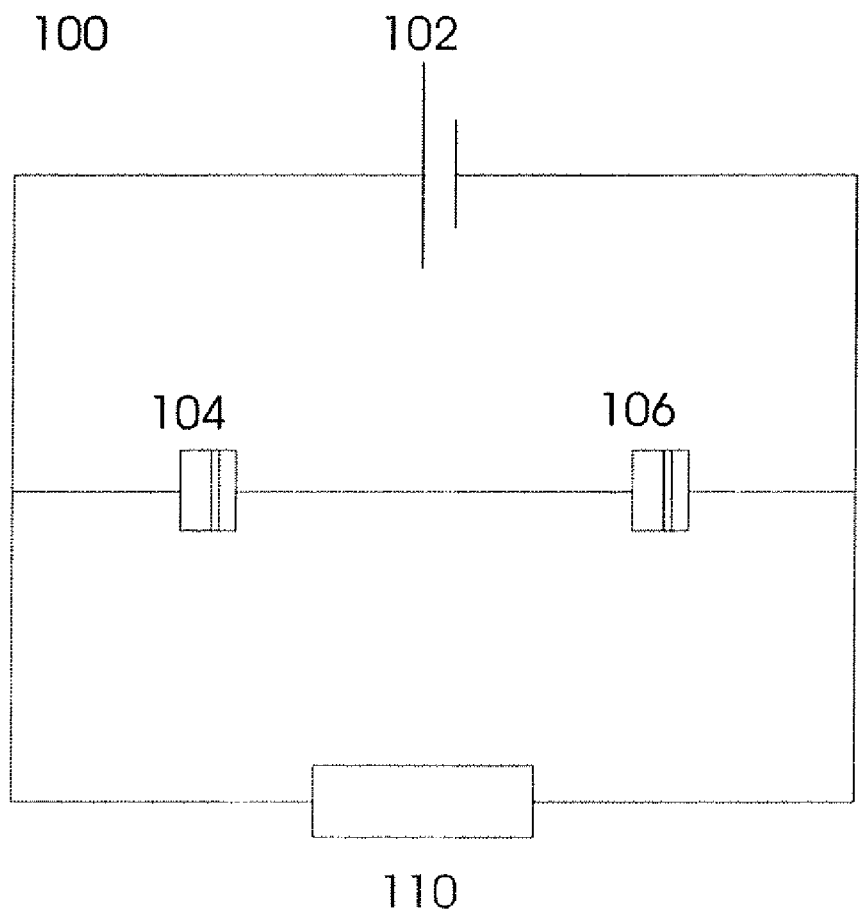
FIG. 1 (PRIOR ART) illustrates a prior art circuit comprising spin torque oscillators.

Referring now to FIG. 1 (PRIOR ART), a circuit 100 according to the prior art is illustrated. The circuit 100 comprises a DC current source 102 and two spin torque oscillators (STO:s) 104, 106 coupled in series. A resistive load 110 is also shown connected in parallel with the STO:s 104, 106. It should be noted that the resistive load 110 is not necessarily a physical resistor, but may be considered as a model of the inherent resistive load in the circuit.

When a DC current is applied to the STO:s 104, 106, the STO:s 104, 106 will start to oscillate due to the spin torque effect described above, generating an net AC current that is created through their shifting resistances. Under specific circumstances (i.e. for certain intervals of DC current strength) the two STO:s will synchronize their oscillations, resulting in a significantly stronger generated AC current. This AC current is mediated through the resistive load 110.

The frequency of the generated AC current can be varied by adjusting the strength of the applied DC current. Typically, an STO has two modes of oscillation, with the magnetization of the free layer in plane or out of plane. In-plane rotation will show a decrease in frequency with applied current and out of plane rotation will show a frequency increase with increased current. The mode of rotation will depend on the strength of the applied DC current.

Figure 2:
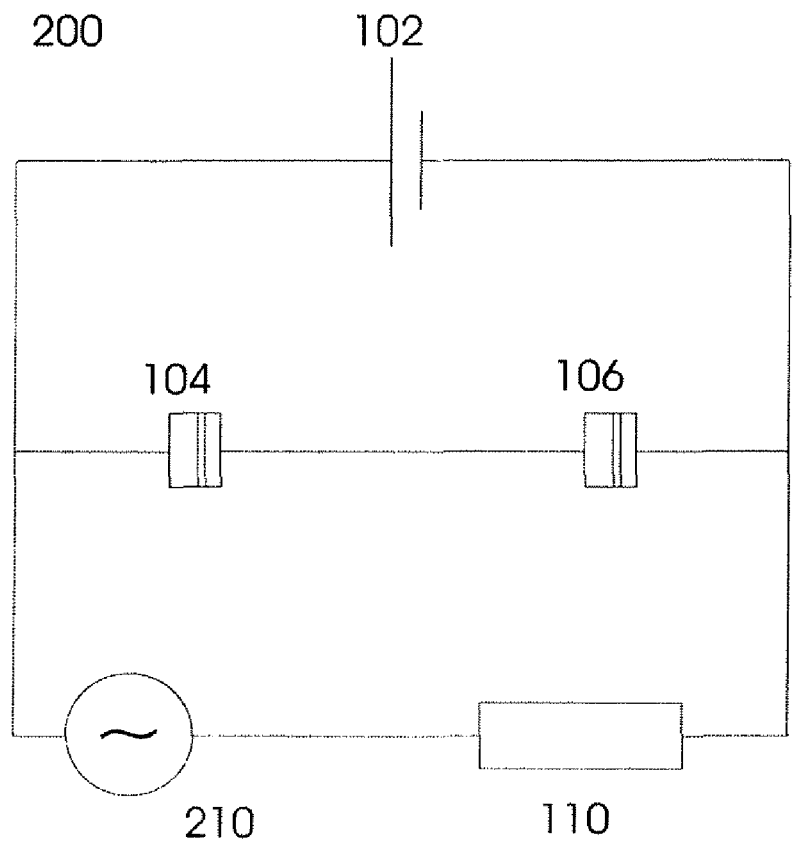
FIG. 2 illustrates a circuit according to an aspect of the invention, with the STO:s connected in series, and a phase shifting device connected in parallel with the STO:s.

FIG. 2 illustrates a circuit 200 according to a first embodiment of the present invention. The circuit 200 comprises a DC current source 102, two spin torque oscillators 104, 106 of which the latter are connected to each other in series, and a phase shifting device 210 connected in parallel to the STO:s 104 and 106. A resistive load 110 is also shown connected in series with the phase shifting device. It should be noted that the resistive load 110 is not necessarily a physical resistor, but may be considered as a model of the inherent resistive load in the circuit 200.

The phase shifting device 210 will cause a phase shift in the AC current being fed back to the STO:s 104 and 106. As mentioned above, a principal effect of this phase shift is that the circuit becomes much less sensitive to differences in the anisotropy fields of the STO:s 104 and 106. That is, the introduced phase shift makes it possible to achieve synchronized oscillation even when the shape-anisotropy fields of STO:s 104 and 106 deviate by up to about 145%.

According to further embodiments of the present invention, the phase shifting device 210 can comprise an inductance (e.g. an inductor), a capacitance (e.g. a capacitor), or a transistor that has an inherent phase shift. Any combination of two or more of the above mentioned components is also possible, provided a net phase shift is achieved. The skilled person will also realize that any other component, or combination of components having inductive and/or capacitive properties can be used instead of the specific phase shifting devices 210 disclosed. More specifically, the net phase shift in the circuit will vary depending on which types of components are used, and how they are physically connected. The resulting phase shift can be determined using standard phasor arithmetic and the laws of electricity.

A transistor generally introduces a phase shift of 180 degrees, and the passive components (the inductor and capacitor) will each introduce a phase shift of 0-90 degrees (depending i.a. on the properties of the resistive load 110).

Typically, a phase shift having an absolute value of about 90° will result in the strongest effect, i.e. the highest increase in tolerance for anisotropy deviations. A phase shift with an absolute value of about 86° is particularly preferred. The optimum phase shift is about +90° when the STO:s oscillate in the in-plane mode, and about −90° in out-of-plane mode. Typically, a range within 90°±10° is preferred.

Thus, in an embodiment of the invention, the phase shifting device 210 comprises a component, or a combination of components, which cause a net phase shift having an absolute value of about 90°.

Figure 3:
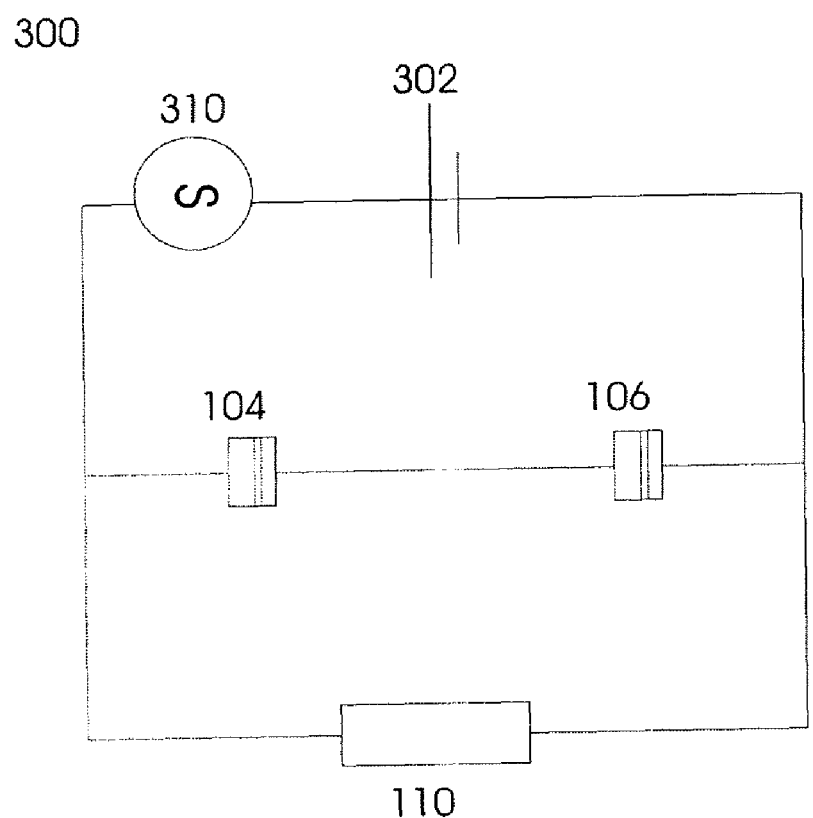
FIG. 3 illustrates a circuit according to an embodiment of the invention, where the DC current source serves as the phase shifting device.

Referring now to FIG. 3, an other embodiment of the present invention is illustrated where the DC current source comprises, or serves as, the phase shifting device 310 providing a phase shift. Thus, FIG. 3 shows a circuit 300 with a non ideal current source 302 comprising a built in phase shift. If this phase shift is well known it can be utilized to optimize the circuit. This is for instance valid in a current source with a built-in capacitance.

According to yet another embodiment of the present invention (not shown), the phase shifting means is provided in one or more of the spin torque oscillators.

Figure 4:
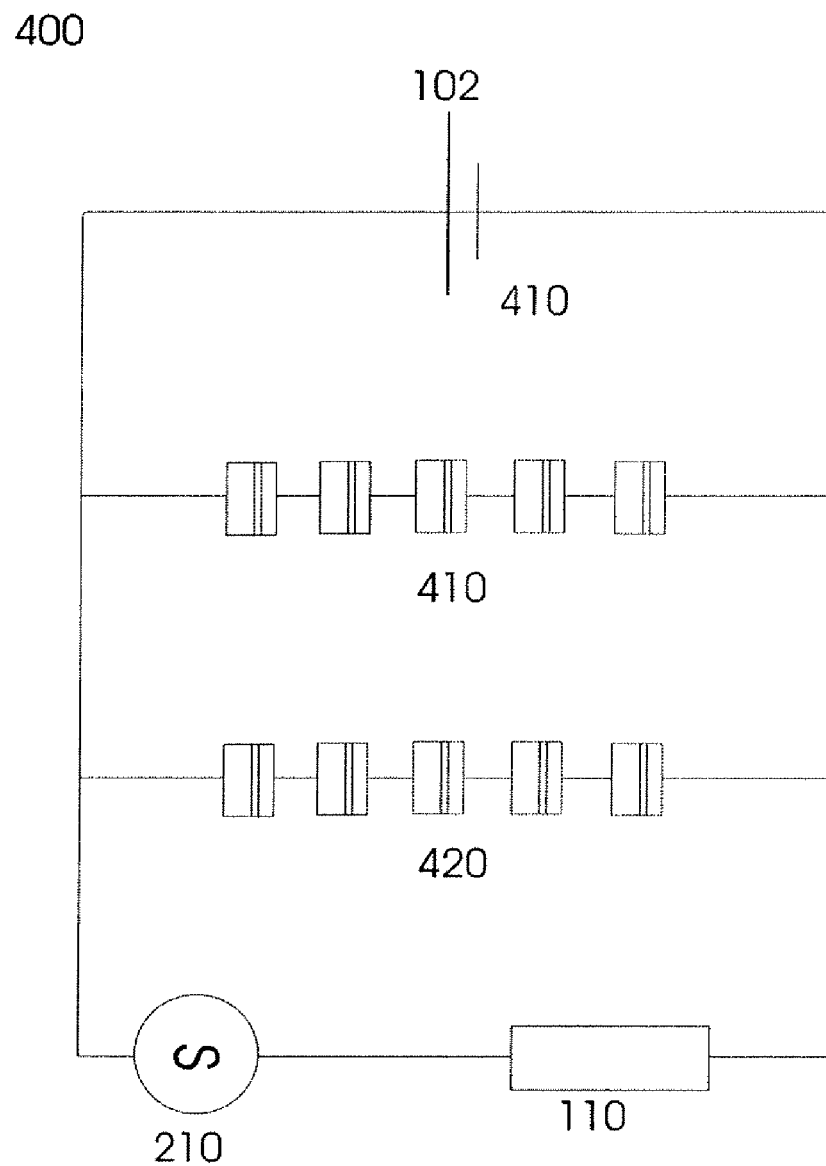
FIG. 4 illustrates a circuit according to yet another embodiment of the invention, where some of the STO:s is connected to each other in parallel.

Now is referred to FIG. 4, showing a circuit 400 according to yet another embodiment of the present invention. The circuit 400 comprises a DC current source 102, and two clusters of STOs 410 and 420, each cluster 410, 420 comprising five STO:s connected in series. The two clusters are connected in parallel to each other and to the DC current source 102. FIG. 4 shows the phase shifting device 210 provided in the bottom arm of the circuit (connected in parallel to DC current source 102, and STO clusters 410 and 420. However, the phase shifting device 210 can be placed in any arm of the connected circuit 400.

Theoretically, there is no upper limit to the number of STOs that can be connected. However, when a large number of such small devices are connected serially, the resistance in the circuit will typically be very high. Thus, the parallel coupling of clusters of STO:s shown in FIG. 4 is typically beneficial if large numbers of STOs are used.

Figure 5A:
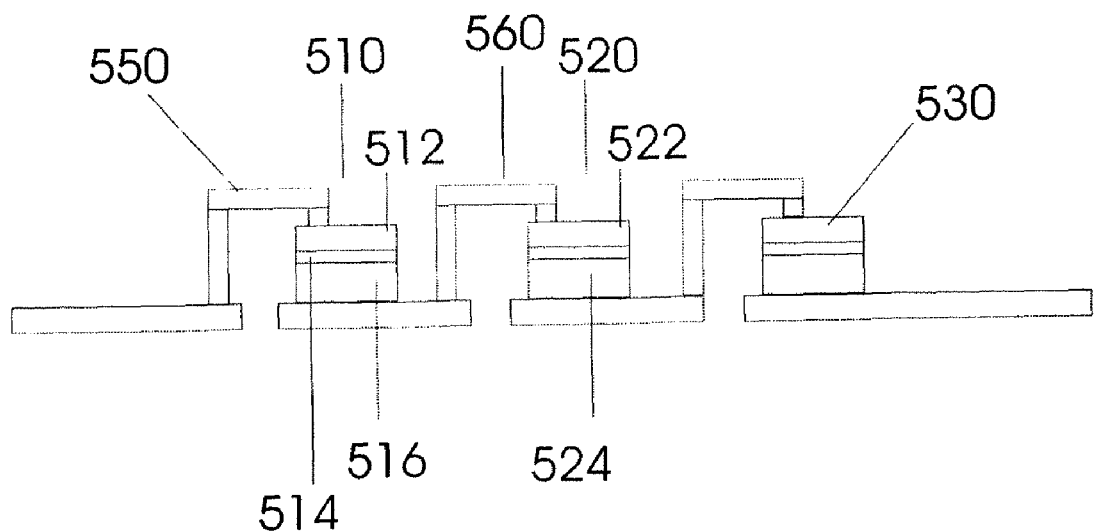
FIG. 5A-5C illustrates various ways that the STO:s can be physically connected to each other.
Figure 5B:
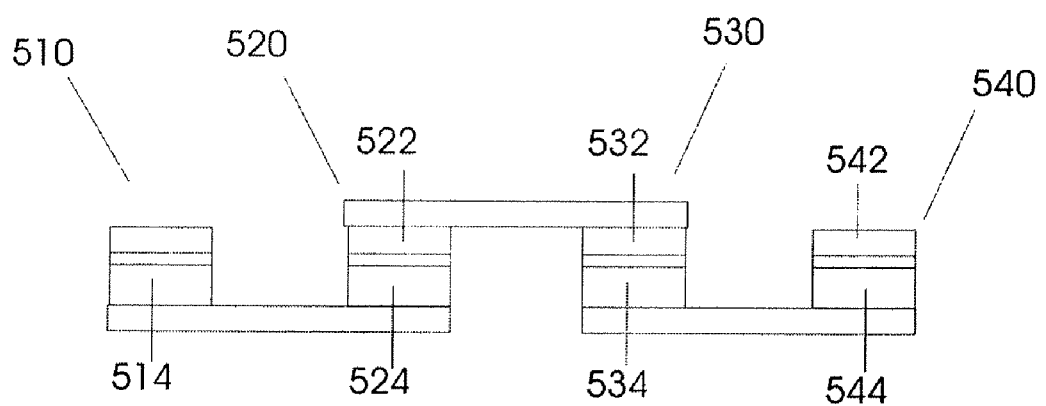
Figure 5C:
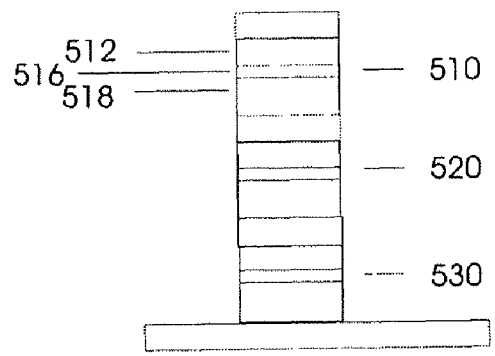

Physically, the STO:s can be connected in different ways, as illustrated in FIGS. 5A-5C.

FIG. 5A illustrates a serial connection between STO:s 510, 520 and 530.

First, we will briefly discuss the structure of a single STO, with reference to STO 510 in FIG. 5A. An STO is usually built by magnetic materials Fe and Co separated by a spacer of either Cu, MgO or $AlO_x$ Thus, the first and third layers 512 and 516 in STO 510 could consist of Fe or Co, whereas the spacer layer 514 could consist of Cu, MgO or $AlO_x$. The first layer 512 and the third layer 516 could be made of the same or different materials. It should be noted that the specific materials mentioned are by way of example only. There are many other materials known in the art for constructing STO:s, and these are all equally applicable to the present invention.

The serial connection between the three STO:s is achieved by connecting the third layer of one STO with the first layer of the next one. Specifically, connecting bridge 550 is connected to the first layer 512 of STO 510. The third layer 516 of STO 510 is connected to the first layer 522 of STO 520, by means of connecting bridge 560. Finally, the third layer 524 of STO 520 is connected to the first layer of STO 530.

A benefit of the arrangement shown in FIG. 5A would typically be an efficient use of all fabricated oscillators. To clarify, all STO:s in the series will oscillate because the current always flows from the first (pinned) layer, through the spacer into the third (free) layer, triggering the spin torque effect as described above. However, in practice this is a hard way of manufacturing serially connected STOs where intricate lithography would most likely be needed.

In FIG. 5B an alternate way of connecting the STO:s is shown. STO:s 510, 520, 530 and 540 are connected so that only every other STO will be working. To be specific, the third layer 514 of STO 510 is connected to the third layer 524 of STO 520. The first layer 522 of STO 520 is then connected to the first layer 532 of STO 530. Finally, the third layer 534 of STO 530 is connected to the third layer 544 of STO 540. This arrangement can be beneficial from a manufacturing standpoint, and is significantly easier to achieve in practice than the arrangement of FIG. 5A. The downside is that only one in two oscillators would contribute to signal generation. This is because no spin torque effect will occur in oscillators 520 and 540, where the current flows "backwards" from the third (free) layer to the first (pinned) layer.

In FIG. 5C, yet another way of connecting the STO:s is shown. Here, a very thick stack of layers is grown and a number of STOs 510, 520, 530 are fabricated on top of each other this way. The benefit here is a more secure way of connecting devices. Like in FIG. 5A, this method of fabrication also makes use of all oscillators. The downside is time of manufacturing, especially if nano contact is needed between each individual STO stack.

In any of these circuits either MTJ or spin valves can be utilized. It is also possible to use a mix of the two different STO types in the same circuit.

The size of the connection between the STOs can vary depending on method. In the setup shown in FIG. 5A the size of the connecting bridge is necessarily quite small, while the connecting material can be thicker in the other two cases.

It should be noted in general that, should several STO:s be connected and such a situation occur that some of them do not oscillate, the non-oscillating STO:s can be treated as non-ideal loads in the circuits. This is only a non-ideal implementation of the same setup.

One newer spin torque oscillator design is the so called perpendicular STO (D. Houssameddine, U. Ebels, B. Delaët, B. Rodmacq, I. Firastrau, F. Ponthenier, M. Brunet, C. Thirion, J.-P. Michel, L. Prejbeanu-Buda, M.-C. Cyrille, O. Redon & B. Dieny, *Spin-torque oscillator using a perpendicular polarizer and a planar free layer, Nature Materials* 6, 447-453 (2007)), where a layer with a magnetization perpendicular to the free layer is inserted. The perpendicular layer will polarize electrons in such a way that the angle of the magnetic moments between electrons favors a movement of the free layer magnetizations out of the plane, as well as an offset of the gilbert damping in the free layer so that continuous oscillation can occur. The invention will also work for a spin torque oscillator that has a so called wavy spin torque, In this oscillator the spin torque is depending on the angle between the magnetizations of the free and fixed layer (:O. Boulle, V. Cros, J. Grollier, L. G. Pereira, C. Deranlot, F. Petroff, G. Faini, J. Barnas & A. Fert *Shaped angular dependence of the spin-transfer torque and microwave generation without magnetic field, Nature Physics* 3, 492-497 (2007)). In this invention this angle dependence will enable the layer to precess in a large angle mode that does not need an external field. A third new STO for witch the invention will work is for the STO where the structure is designed in such a way that a magnetic vortex can be formed in the free and fixed layers (V. S. Pribiag, I. N. Krivorotov, G. D. Fuchs, P. M. Braganca, O. Ozatay, J. C. Sankey, D. C. Ralph & R. A. Buhrmann, *Magnetic vortex oscillator driven by d.c. spin-polarized current", Nature Physics* 3, 498-503 (2007)). By applying a spin torque to this structure the vortex cores will rotate. This structure, like the others described, will not need a field perpendicular to the plane of the free layer to function.

The foregoing detailed description is intended to illustrate and provide easier understanding of the invention, and should not be construed as limitations.

Alternative embodiments will become apparent to those skilled in the art without departing from the spirit and scope of the present invention.

LIST OF REFERENCES

1. Type: Perpendicularly polarized STO. Ref: "Spin-torque oscillator using a perpendicular polarizer and a planar free layer", D. Houssameddine, U. Ebels, B. Delaët, B. Rodmacq, I. Firastrau, F. Ponthenier, M. Brunet, C. Thirion, J.-P. Michel, L. Prejbeanu-Buda, M.-C. Cyrille, O. Redon & B. Dieny, Nature Materials 6, 447-453 (2007) http://www.nature.com/nmat/journal/v6/n6/abs/nmat1905.html
2. Type: STO with shaped angular dependence of torque strength. Ref: "Shaped angular dependence of the spin-transfer torque and microwave generation without magnetic field", O. Boulle, V. Cros, J. Grollier, L. G. Pereira, C. Deranlot, F. Petroff, G. Faini, J. Barnas & A. Fert, Nature Physics 3, 492-497 (2007) http://www.nature.com/nphys/journal/v3/n7/abs/nphys618.html 3. Type: Vortex STO. Ref: "Magnetic vortex oscillator driven by d.c. spin-polarized current", V. S. Pribiag, I. N. Krivorotov, G. D. Fuchs, P. M. Braganca, O. Ozatay, J. C. Sankey, D. C. Ralph & R. A. Buhrman, Nature Physics 3, 498-503 (2007) http://www.nature.com/nphys/journal/v3/n7/abs/nphys619.html

The invention claimed is:

1. A circuit comprising a DC current source and at least two spin torque oscillators, the at least two spin torque oscillators being electrically coupled to each other and to the DC current source, the circuit comprising phase shifting means connected in such a way as to cause a phase shift between current and voltage through the spin torque oscillators, and wherein the circuit comprising the phase shifting means is connected in parallel to at least two of the spin torque oscillators.

2. The circuit of claim 1, wherein the phase shifting means comprises a capacitance.

3. The circuit of claim 2, wherein the phase shifting means comprises a capacitor.

4. The circuit of claim 3, wherein the capacitor is within a range of 50-100 nf.

5. A circuit comprising a DC current source and at least two spin torque oscillators, the at least two spin torque oscillators being electrically coupled to each other and to the DC current source, the circuit comprising phase shifting means connected in such a way as to cause a phase shift between current and voltage through the spin torque oscillators, and wherein the phase shifting means comprises a transistor.

6. The circuit of claim 1, wherein the phase shifting means comprises an inductance.

7. The circuit of claim 6, wherein the phase shifting means comprises an inductor.

8. The circuit of claim 1, wherein the phase shifting means comprises a combination of two or more components selected from the set of: capacitance, inductance, or transistor.

9. The circuit of claim 1, wherein the phase shifting means is arranged to produce a phase shift with an absolute value of about 90°.

10. A circuit comprising a DC current source and at least two spin torque oscillators, the at least two spin torque oscillators being electrically coupled to each other and to the DC current source, the circuit comprising phase shifting means connected in such a way as to cause a phase shift between current and voltage through the spin torque oscillators, and wherein the phase shifting means is arranged to produce a phase shift with an absolute value of about 86°.

11. The circuit of claim 1, wherein the phase shifting means is provided in one or more of the spin torque oscillators.

12. The circuit of claim 11, wherein the phase shifting means is arranged to produce a phase shift with an absolute value of about 90°.

13. The circuit of claim 11, wherein the phase shifting means is arranged to produce a phase shift with an absolute value of about 86°.

* * * * *